(12) United States Patent
Wang et al.

(10) Patent No.: US 10,819,291 B2
(45) Date of Patent: Oct. 27, 2020

(54) OPERATIONAL AMPLIFIER AND CONTROL METHOD THEREOF

(71) Applicant: SHENZHEN GOODIX TECHNOLOGY CO., LTD., Guangdong (CN)

(72) Inventors: Wen-Chi Wang, Guangdong (CN); Si Herng Ng, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/659,316

(22) Filed: Oct. 21, 2019

(65) Prior Publication Data
US 2020/0052655 A1 Feb. 13, 2020

Related U.S. Application Data

(63) Continuation of application No. PCT/CN2018/082868, filed on Apr. 12, 2018.

(51) Int. Cl.
*H03F 1/30* (2006.01)
*H03F 1/34* (2006.01)
(Continued)

(52) U.S. Cl.
CPC ............... *H03F 1/303* (2013.01); *H03F 1/34* (2013.01); *H03F 3/211* (2013.01);
(Continued)

(58) Field of Classification Search
CPC ..................................................... H03F 1/303
(Continued)

(56) References Cited

U.S. PATENT DOCUMENTS 5,942,942 A * 8/1999 Wang ..................... G06F 3/038
330/258
8,138,826 B1 3/2012 Bhatt et al.
(Continued)

FOREIGN PATENT DOCUMENTS

CN 101588157 A 11/2009
CN 101933224 A 12/2010
(Continued)

OTHER PUBLICATIONS

English abstract translation of CN101588157A.
(Continued)

*Primary Examiner* — Patricia T Nguyen
(74) *Attorney, Agent, or Firm* — WPAT, P.C., Intellectual Property Attorneys; Anthony King

(57) ABSTRACT

An operational amplifier includes: a first amplifier stage, configured to generate first output voltages according to first input voltages; a second amplifier stage, configured to generate second output voltages according to the first output voltages; a second output stage circuit, configured to replicate an equivalent or a scaled-down version of the first output stage circuit; a first common-mode feedback circuit, configured to keep an output common-mode voltage of the second output stage circuit at a predetermined value; a logic loop circuit configured to, when the operational amplifier operates in a direct current calibration phase, adjust a difference between the first output voltages; a bias circuit, configured to generate a voltage close to a common-mode voltage of the first output voltages produced after the operational amplifier is turned on, the voltage serving as a reference voltage of a second common-mode feedback circuit.

20 Claims, 4 Drawing Sheets

(51) Int. Cl.
  *H03F 3/21* (2006.01)
  *H03F 3/45* (2006.01)
(52) U.S. Cl.
  CPC ... *H03F 3/45071* (2013.01); *H03F 2200/135* (2013.01); *H03F 2200/156* (2013.01); *H03F 2200/375* (2013.01); *H03F 2203/45044* (2013.01); *H03F 2203/45212* (2013.01); *H03F 2203/45512* (2013.01); *H03F 2203/45521* (2013.01); *H03F 2203/45534* (2013.01)
(58) Field of Classification Search
  USPC .......................................................... 330/260
  See application file for complete search history.

(56) References Cited

U.S. PATENT DOCUMENTS

| | | | | |
|---|---|---|---|---|
| 9,647,639 | B1* | 5/2017 | Chamas | H03F 3/19 |
| 2008/0197928 | A1 | 8/2008 | Watson | |
| 2008/0284507 | A1* | 11/2008 | Pertijs | H03F 3/45475 |
| | | | | 330/9 |
| 2009/0002075 | A1* | 1/2009 | Chilakapati | H03F 3/20 |
| | | | | 330/297 |
| 2011/0001560 | A1 | 1/2011 | Eschauzier et al. | |
| 2014/0340147 | A1 | 11/2014 | Schuurmans et al. | |
| 2016/0043696 | A1* | 2/2016 | Raimondi | H03F 3/2173 |
| | | | | 381/120 |
| 2016/0173034 | A1 | 6/2016 | Lin | |
| 2018/0069513 | A1* | 3/2018 | Kumar | H03F 3/45941 |
| 2019/0028061 | A1* | 1/2019 | Yeh | H03F 3/245 |
| 2020/0136639 | A1* | 4/2020 | Kinyua | H03F 3/45273 |

FOREIGN PATENT DOCUMENTS

| | | |
|---|---|---|
| CN | 104467704 A | 3/2015 |
| TW | 201044889 A | 12/2010 |

OTHER PUBLICATIONS

English abstract translation of CN101933224A.
English abstract translation of CN104467704A.
English abstract translation of TW201044889A.
ISA/210—Outgoing International Search Report for PCT/CN2018/082868.
PCT request and application as filed for PCT/CN2018/082868.

* cited by examiner

OPERATIONAL AMPLIFIER AND CONTROL METHOD THEREOF

CROSS-REFERENCE TO RELATED APPLICATIONS

The present application is a continuation of international application No. PCT/CN2018/082868, filed on Apr. 12, 2018, of which is incorporated herein by reference in its entirety.

TECHNICAL FIELD

The present disclosure relates to an operational amplifier and, more particularly, to an operational amplifier used for a class AB amplifier to reduce voltage spikes generated when the class AB amplifier is turned on.

BACKGROUND

Class AB amplifiers are widely used in audio applications. In the audio applications, pop noise is one of typical specifications. Pop noise is an uncomfortable popping sound generated when an audio circuit/device is powered on or powered off. The uncomfortable popping sound is caused by instantaneous voltage spikes or direct current (DC) voltage variations generated at an output terminal of the audio circuit/device. Generally, when an offset voltage outputted by a class AB amplifier is less than 0.1 millivolt (mV) or a magnitude of a voltage spike is less than 10 mV, the human ear cannot hear pop noise. One may utilize an offset calibration technique to an operational amplifier (OPAMP) to thereby reduce an offset voltage of the class AB amplifier. However, a conventional voltage spike reduction method is not effective in reducing voltage spikes because of high sensitivity to process, voltage and temperature variations. A voltage spike of 10 mV to 100 mV is still generated. Please note that, in addition to reducing voltage spikes generated in response to the turning on of the class AB amplifier, it is desired to prevent an instantaneous circuit response, generated within the class AB amplifier during the turning on, from directly affecting an output of the class AB amplifier. In view of the foregoing, there is a need for improvement in the prior art.

SUMMARY

Therefore, a main object of the present disclosure is to provide an operational amplifier used for a class AB amplifier and a related control method to reduce voltage spikes, thereby overcoming disadvantages of the related art.

To resolve the above issues, the present disclosure provides an operational amplifier. The operational amplifier comprises: a first amplifier stage, configured to generate a plurality of first output voltages according to a plurality of first input voltages; a second amplifier stage, coupled to the first amplifier stage, the second amplifier stage configured to generate a plurality of second output voltages according to the first output voltages; a second output stage circuit, coupled to the second amplifier stage and a first output stage circuit, the second output stage circuit configured to replicate an equivalent or a scaled-down version of the first output stage circuit; a first common-mode feedback circuit, coupled to the second amplifier stage and the second output stage circuit, the first common-mode feedback circuit configured to keep an output common-mode voltage of the second output stage circuit at a predetermined value; a logic loop circuit, coupled to the first amplifier stage, the logic loop circuit configured to adjust a difference between the first output voltages of the first amplifier stage; a bias circuit, configured to generate a voltage close to a common-mode voltage of a plurality of second input voltages of the second amplifier stage, wherein the common-mode voltage is produced after the operational amplifier is turned on; a second common-mode feedback circuit, coupled to the first amplifier stage, the second common-mode feedback circuit configured to keep an output common-mode voltage of the first output voltages of the first amplifier stage at a reference voltage, wherein the voltage generated by the bias circuit serves as the reference voltage; and a plurality of switches, configured to control connection between the first amplifier stage, the second amplifier stage, the first output stage circuit, the second output stage circuit, the first common-mode feedback circuit, the logic loop circuit and the second common-mode feedback circuit to enable the operational amplifier to operate in an offset calibration phase.

For example, the output common-mode voltage of the second output stage circuit is close to an output common-mode voltage produced after the operational amplifier is turned on.

For example, the first output stage circuit is coupled to a plurality voltage sources and the second output stage circuit through the switches; when the operational amplifier turns on, the first output stage circuit is turned on according to a switching status of the switches.

For example, when the logic loop circuit is configured to adjust the difference between the first output voltages of the first amplifier stage, the first output stage circuit is turned off.

For example, after the offset calibration phase finishes, and direct current calibration finishes, the difference between the first output voltages of the first amplifier stage is close to zero, the second output stage circuit, the first common-mode feedback circuit, the second common-mode feedback circuit and the logic loop circuit are turned off, and the first output stage circuit and a third common-mode feedback circuit are turned on.

For example, the third common-mode feedback circuit is coupled to the first amplifier stage, and configured to keep an output common-mode voltage of a plurality of output voltages of the operational amplifier at the predetermined value.

By establishing a voltage close to a stable voltage of each node in advance, the proposed operational amplifier can reduce voltage spikes to prevent generation of pop noise.

DESCRIPTION

Objectives, features and advantages of the present disclosure will be better understood by reference to the following detailed description of embodiments of the present disclosure, taken in conjunction with the accompanying drawings.

It should be understood that the specific embodiments described herein are provided for illustrative purposes, and are not intended to limit the present disclosure.

Figure 1:
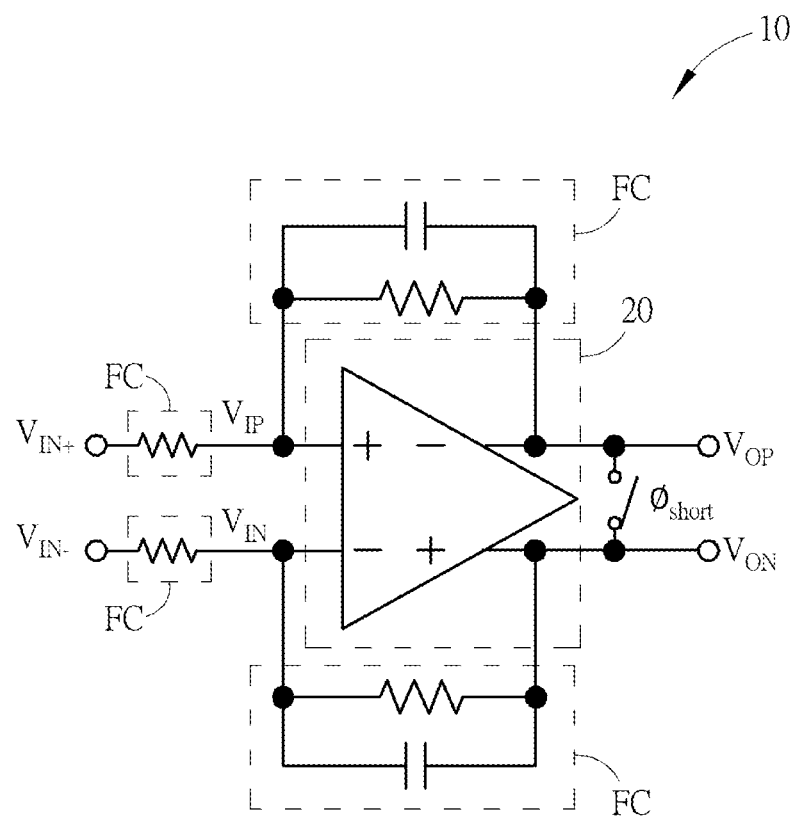
FIG. 1 illustrates an exemplary class AB amplifier in accordance with the embodiments of the present disclosure.

Referring to FIG. 1, a class AB amplifier 10 is illustrated in accordance with the embodiments of the present disclosure. The class AB amplifier 10 includes a plurality of input voltages $V_{IN+}$ and $V_{IN-}$, an operational amplifier 20, a switch $\emptyset_{short}$ and a plurality of feedback circuits $F_C$. The operational amplifier 20 is configured to convert a plurality of input voltages $V_{IP}$ and $V_{IN}$ into a plurality of output voltages $V_{OP}$ and $V_{ON}$. During offset calibration phase or in an offset calibration, the operational amplifier 20 can be configured to establish a voltage close to a stable voltage of each node therewithin in advance. As a result, when the class AB amplifier 10 is turned on, i.e. the operational amplifier 20 is turned on, an offset voltage can be reduced to lower/eliminate pop noise.

Figure 2:
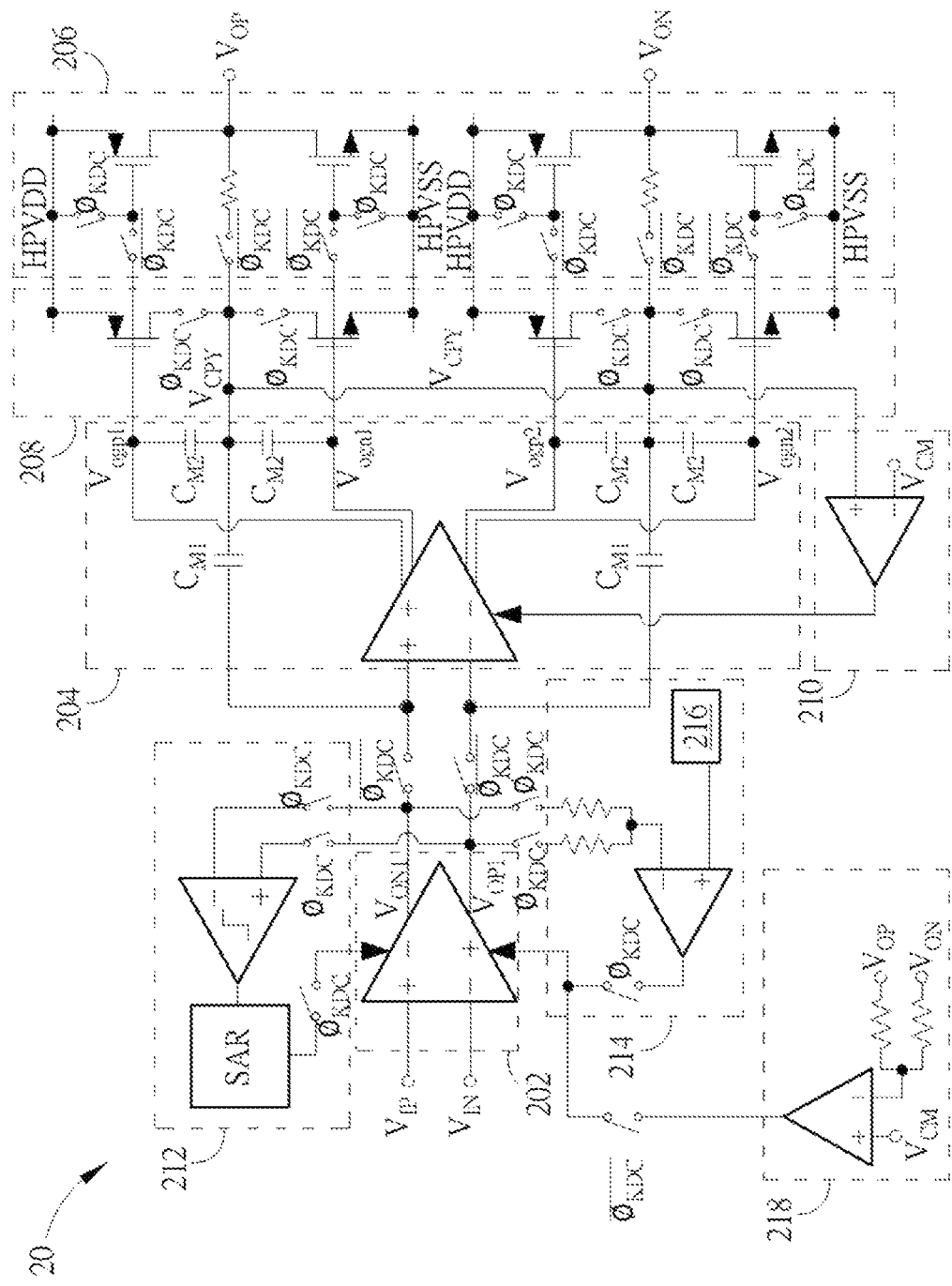
FIG. 2 illustrates an exemplary operational amplifier in accordance with some embodiments of the present disclosure.

Specifically, referring to FIG. 2, an implementation of the operational amplifier 20 is illustrated in accordance with some embodiments of the present disclosure. The operational amplifier 20 includes a first amplifier stage 202, a second amplifier stage 204, a first output stage circuit 206, a second output stage circuit 208, a first common-mode feedback circuit 210, a logic loop circuit 212, a second common-mode feedback circuit 214, a bias circuit 216, and a plurality of switches $\emptyset_{KDC}$ and $\overline{\emptyset_{KDC}}$.

The first amplifier stage 202 is configured to generate a plurality of first output voltages $V_{ON1}$ and $V_{OP1}$ according to the input voltages $V_{IP}$ and $V_{IN}$ of the operational amplifier 20.

The second amplifier stage 204, coupled to the first amplifier stage 202, is configured to generate a plurality of second output voltages $V_{ogp1}$, $V_{ogn1}$, $V_{ogp2}$ and $V_{ogn2}$ according to the first output voltages $V_{ON1}$ and $V_{OP1}$.

During offset calibration or in an offset calibration phase, the logic loop circuit 212 is configured to adjust a difference D between the first output voltages $V_{ON1}$ and $V_{OP1}$ of the first amplifier stage 202.

After the operational amplifier 20 starts performing the offset calibration, the bias circuit 216 is configured to generate a voltage close to a stable voltage of an input node of the second amplifier stage 204, wherein the stable voltage of the input node is produced after the operational amplifier 20 is turned on. The generated voltage can serve as a reference voltage of the second common-mode feedback circuit 214.

An output terminal of the second common-mode feedback circuit 214 is coupled to the first amplifier stage 202. During the offset calibration or in the offset calibration phase, the second common-mode feedback circuit 214, serving as common-mode feedback of the first amplifier stage 202, is configured to keep an output common-mode voltage of the first output voltages $V_{ON1}$ and $V_{OP1}$ of the first amplifier stage 202 at the aforementioned reference voltage.

The first output stage circuit 206 is coupled to a voltage HPVDD, a voltage HPVSS and the second output stage circuit 208 through the switches $\emptyset_{KDC}$ and $\overline{\emptyset_{KDC}}$. Connection between the first output stage circuit 206 and the second output stage circuit 208 is controlled by a switching status of the switches $\emptyset_{KDC}$ and $\overline{\emptyset_{KDC}}$.

The second output stage circuit 208 is coupled to the second amplifier stage 204 and the first output stage circuit 206. In the offset calibration phase, the second output stage circuit 208 is configured to replicate the first output stage circuit 206 to provide an equivalent or a scaled-down version of the first output stage circuit 206. After the operational amplifier is turned on, the second output stage circuit 208 is turned off.

The first common-mode feedback circuit 210 is coupled between the second amplifier stage 204 and the second output stage circuit 208. In the offset calibration phase, the first common-mode feedback circuit 210 is configured to keep an output common-mode voltage $V_{CPY}$ of the second output stage circuit 208 at an output common-mode voltage $V_{CM}$ produced after the operational amplifier 20 is turned on.

In addition, the switches $\emptyset_{KDC}$ and $\overline{\emptyset_{KDC}}$ disposed in the operational amplifier 20 is configured to control connection between the first amplifier stage 202, the second amplifier stage 204, the first output stage circuit 206, the second output stage circuit 208, the first common-mode feedback circuit 210, the logic loop circuit 212 and the second common-mode feedback circuit 214 according to a control signal POW, thereby enabling the operational amplifier 20 to operate in the offset calibration phase or a turn-on phase.

As a result, during the offset calibration which is performed before the operational amplifier 20 is turned on, a common-mode voltage of the first amplifier stage 202 is close to a stable voltage of an input node of the second amplifier stage 204 which operates normally, thus preventing great variations in the first output voltages $V_{ON1}$ and $V_{OP1}$ when the operational amplifier 20 is turned on. Additionally, the operational amplifier 20 can replicate a voltage at each node of the first output stage circuit 206 with the use of the second output stage circuit 208, and keep the output common-mode voltage $V_{CPY}$ at $V_{CM}$ with the use of the first common-mode feedback circuit 210. As a result, during the offset calibration, the operational amplifier 20 can establish voltages, respectively close to stable voltages of nodes, in advance to thereby reduce voltage spikes generated when the operational amplifier 20 is turned on. The stable voltages of the nodes, i.e. the second output voltages $V_{ogp1}$, $V_{ogn1}$, $V_{ogp2}$ and $V_{ogn2}$, are produced after the operational amplifier 20 is turned on.

The operational amplifier 20 further includes a third common-mode feedback circuit 218 and a plurality of compensation capacitors $C_{M1}$ and $C_{M2}$. The third common-mode feedback circuit 218, coupled to the first amplifier stage 202, is turned on when the operational amplifier 20 is turned on, so as to provide feedback to the first amplifier stage 202 according to the output common-mode voltage $V_{CM}$, thereby keeping the output voltages $V_{OP}$ and $V_{ON}$ of the operational amplifier 20 at the output common-mode voltage.

Figure 3:
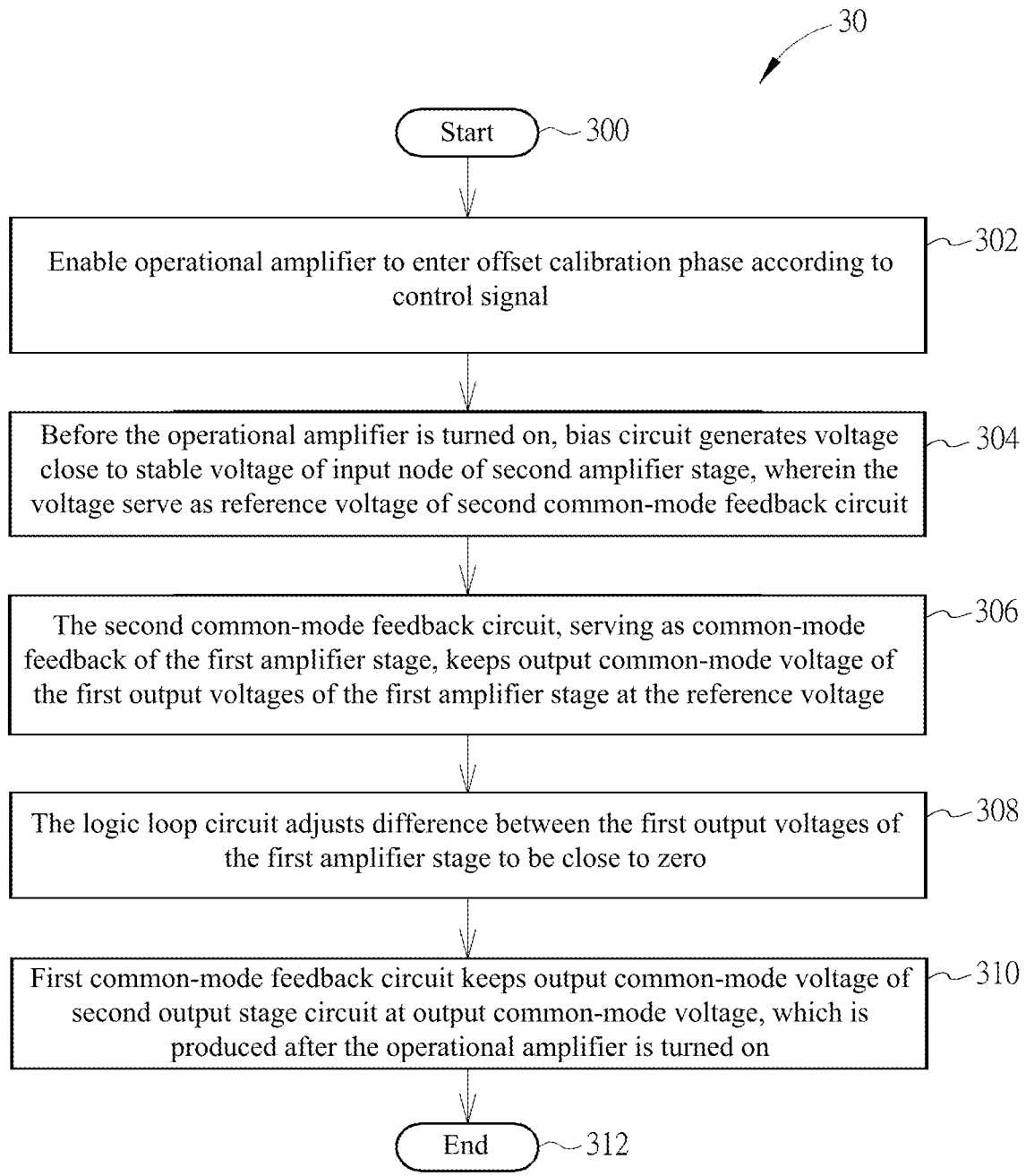
FIG. 3 illustrates an exemplary control method in accordance with some embodiments of the present disclosure.

Referring to FIG. 3, an operating principle of the operational amplifier 20 is illustrated. FIG. 3 is a diagram illustrating a control method 30 in accordance with some embodiments of the present disclosure. Before the operational amplifier 20 is turned on, the operational amplifier 20 can perform offset calibration according to the control method 30 to thereby establish a voltage close to a stable voltage of each node in advance. The control method 30 can be described in detail below.

Step 300: Start.

Step 302: Enable the operational amplifier 20 to enter an offset calibration phase according to a control signal POW.

Step 304: Before the operational amplifier 20 is turned on, the bias circuit 216 generates a voltage close to a stable voltage of an input node of the second amplifier stage 204. The stable voltage is produced after the operational amplifier 20 is turned on. The voltage close to the stable voltage can serve as a reference voltage of the second common-mode feedback circuit 214.

Step 306: The second common-mode feedback circuit 214, serving as common-mode feedback of the first amplifier stage 202, keeps an output common-mode voltage of the first output voltages $V_{ON1}$ and $V_{OP1}$ of the first amplifier stage 202 at the reference voltage.

Step 308: The logic loop circuit 212 adjusts the difference D between the first output voltages $V_{ON1}$ and $V_{OP1}$ of the first amplifier stage 202 to be close to zero.

Step 310: The first common-mode feedback circuit 210 keeps the output common-mode voltage $V_{CPY}$ of the second output stage circuit 208 at the output common-mode voltage $V_{CM}$, which is produced after the operational amplifier 20 is turned on.

Step 312: End.

In view of the above, before the operational amplifier 20 is turned on, the control method 30 can perform the offset calibration according to steps 302, 304 and 306, thereby establishing a voltage close to a stable voltage of each node in advance. According to step 308, the logic loop circuit 212 can adjust the difference D between the first output voltages $V_{ON1}$ and $V_{OP1}$ of the first amplifier stage 202 to zero, or approach zero. In other words, the first output voltages $V_{ON1}$ and $V_{OP1}$ can be adjusted to a same voltage level. As a result, when the operational amplifier 20 is turned on, voltage spikes can be reduced to avoid generation of pop noise.

It is worth noting that, during the offset calibration, the logic loop circuit 212 can adjust the difference D between the first output voltages $V_{ON1}$ and $V_{OP1}$ of the first amplifier stage 202, while the first output stage circuit 206 of the operational amplifier 20 stays in an off state. In other words, during the offset calibration which is performed by the operational amplifier 20 according to the control method 30, voltage variations at each node, e.g. variations in the first output voltages $V_{ON1}$ and $V_{OP1}$, do not reflect in the output voltages $V_{ON}$ and $V_{OP}$ of the operational amplifier 20 such that voltage spikes would not be generated. In addition, when the difference D between the first output voltages $V_{ON1}$ and $V_{OP1}$ of the first amplifier stage 202 approaches zero, the offset calibration may come to an end. In the meantime, the second output stage circuit 208, the first common-mode feedback circuit 210, the logic loop circuit 212 and the second common-mode feedback circuit 214 are turned off, and the first output stage circuit 206 and the third common-mode feedback circuit 218 are turned on.

As a voltage close to a stable voltage of each node, i.e. the first output voltages $V_{ON1}$ and $V_{OP1}$ and the second output voltages $V_{ogp1}$, $V_{ogn1}$, $V_{ogp2}$ and $V_{ogn2}$, has been established in advance, a voltage at each node will not vary greatly after the operational amplifier 20 is turned on, which can greatly reduce output voltage spikes in the operational amplifier 20 to thereby prevent generation of pop noise.

Figure 4:
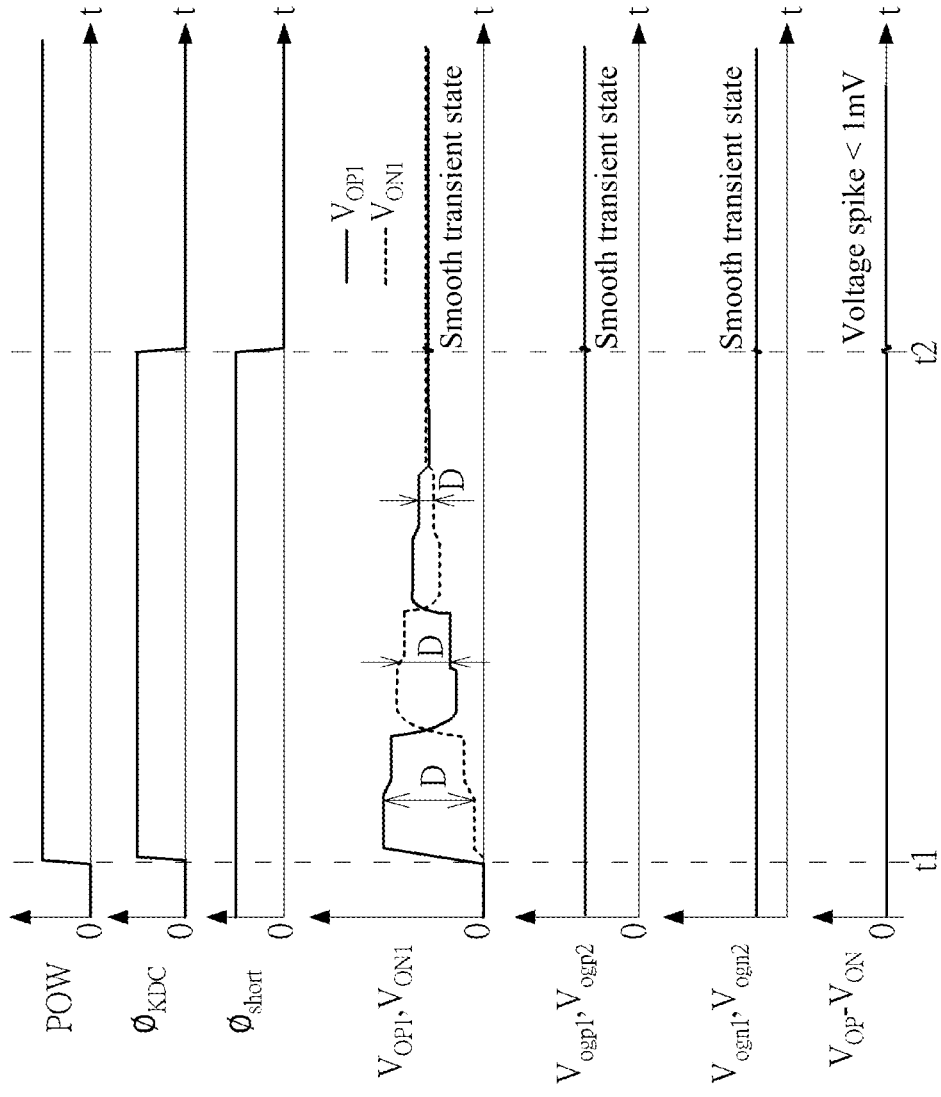
FIG. 4 illustrates a timing diagram of signals associated with an operational amplifier in accordance with some embodiments of the present disclosure.

Next, referring to FIG. 4, a timing diagram of signals associated with the operational amplifier 20 is illustrated in accordance with some embodiments of the present disclosure.

As shown in FIG. 4, after a supply voltage is provided and stable, the control signal POW changes from a low level to a high level at a time t1. The operational amplifier 20 can perform offset calibration.

Between the time t1 and a time t2, the logic loop circuit 212 can adjust the first output voltages $V_{ON1}$ and $V_{OP1}$ of the first amplifier stage 202 to thereby calibrate an offset voltage. As a result, the difference D between the first output voltages $V_{ON1}$ and $V_{OP1}$ of the first amplifier stage 202 can become smaller and smaller until the difference D between the first output voltages $V_{ON1}$ and $V_{OP1}$ is close to zero. In other words, each of the first output voltages $V_{ON1}$ and $V_{OP1}$ may approach a stable voltage of an input node of the second amplifier stage 204, wherein the stable voltage is produced at the input node after the operational amplifier 20 is turned on. Additionally, the second output voltages $V_{ogp1}$, $V_{ogn1}$, $V_{ogp2}$ and $V_{ogn2}$ of the second amplifier stage 204 can finally approach respective stable voltages of nodes, respectively, with the use of the second output stage circuit 208 and the first common-mode feedback circuit 210. During the offset calibration, i.e. between the times t1 and t2, the first output stage circuit 206 of the operational amplifier 20 is turned off. As a result, during the offset calibration which is performed by the operational amplifier 20 according to the control method 30, voltage variations at each node, e.g, variations in the first output voltages $V_{ON1}$ and $V_{OP1}$, do not reflect in the output voltages $V_{ON}$ and $V_{OP}$ of the operational amplifier 20 such that voltage spikes would not be generated.

At the time t2, the offset calibration finishes. In the meantime, the second output stage circuit 208, the first common-mode feedback circuit 210, the logic loop circuit 212 and the second common-mode feedback circuit 214 are turned off, and the first output stage circuit 206 and the third common-mode feedback circuit 218 are turned on. As a voltage close to a stable voltage of each node has been established in advance, each node voltage of the operational amplifier 20, i.e. the first output voltages $V_{ON1}$ and $V_{OP1}$, the second output voltages $V_{ogp1}$, $V_{ogn1}$, $V_{ogp2}$ and $V_{ogn2}$ and the output voltages $V_{ON}$ and $V_{OP}$, can achieve a smooth transient state to prevent large variations in voltage. As a result, by establishing a voltage close to a stable voltage of each node in advance, the operational amplifier 20 used for the class AB amplifier 10 can greatly reduce a voltage spike to a voltage level less than 1 mV.

It is worth noting that the aforementioned embodiments are provided for illustrating the spirit of the present disclosure. Those skilled in the art can recognize that the aforementioned embodiments can be appropriately modified. For example, the aforementioned switch can be implemented using a transistor switch or other types of switches. As another example, circuits such as a logic circuit can be implemented using, but not limited to, other circuits having identical functions. Such modifications can be applied to the present disclosure.

To sum up, by establishing a voltage close to a stable voltage of each node in advance, the proposed operational amplifier used for a class AB amplifier can reduce voltage spikes to prevent generation of pop noise.

The foregoing description provides merely several embodiments of the present disclosure, and is not intended to limit the present disclosure. Those skilled in the art should appreciate that all modifications, alterations and improvements, realized in accordance with the spirit and principles of the present disclosure, fall within the scope of the present disclosure.

What is claimed is:

1. An operational amplifier, comprising:
a first amplifier stage, configured to generate a plurality of first output voltages according to a plurality of first input voltages;
a second amplifier stage, coupled to the first amplifier stage, the second amplifier stage configured to generate a plurality of second output voltages according to the first output voltages;
a second output stage circuit, coupled to the second amplifier stage and a first output stage circuit, the second output stage circuit configured to replicate an equivalent or a scaled-down version of the first output stage circuit;

a first common-mode feedback circuit, coupled to the second amplifier stage and the second output stage circuit, the first common-mode feedback circuit configured to keep an output common-mode voltage of the second output stage circuit at a predetermined value;

a logic loop circuit, coupled to the first amplifier stage, the logic loop circuit configured to adjust a difference between the first output voltages of the first amplifier stage;

a bias circuit, configured to generate a voltage close to a common-mode voltage of a plurality of second input voltages of the second amplifier stage, wherein the common-mode voltage is produced after the operational amplifier is turned on;

a second common-mode feedback circuit, coupled to the first amplifier stage, the second common-mode feedback circuit configured to keep an output common-mode voltage of the first output voltages of the first amplifier stage at a reference voltage, wherein the voltage generated by the bias circuit serves as the reference voltage; and a plurality of switches, configured to control connection between the first amplifier stage, the second amplifier stage, the first output stage circuit, the second output stage circuit, the first common-mode feedback circuit, the logic loop circuit and the second common-mode feedback circuit to enable the operational amplifier to operate in an offset calibration phase.

2. The operational amplifier of claim 1, wherein the output common-mode voltage of the second output stage circuit is close to an output common-mode voltage of the operational amplifier produced after the operational amplifier is turned on.

3. The operational amplifier of claim 1, wherein the first output stage circuit is coupled to a plurality voltage sources and the second output stage circuit through the switches; when the operational amplifier turns on, the first output stage circuit is turned on according to a switching status of the switches.

4. The operational amplifier of claim 1, wherein when the logic loop circuit is configured to adjust the difference between the first output voltages of the first amplifier stage, the first output stage circuit is turned off.

5. The operational amplifier of claim 1, wherein after the offset calibration phase finishes, the difference between the first output voltages of the first amplifier stage is close to zero.

6. The operational amplifier of claim 5, wherein after the offset calibration phase finishes, the second output stage circuit, the first common-mode feedback circuit, the second common-mode feedback circuit and the logic loop circuit are turned off, and the first output stage circuit and a third common-mode feedback circuit are turned on.

7. The operational amplifier of claim 6, wherein the third common-mode feedback circuit is coupled to the first amplifier stage, and configured to keep an output common-mode voltage of a plurality of output voltages of the operational amplifier at the predetermined value.

8. A control method for offset calibration of an operational amplifier, the operational amplifier comprising a first amplifier stage, a second amplifier stage, a second output stage circuit, a first common-mode feedback circuit and a logic loop circuit, the control method comprising:

utilizing the first amplifier stage to generate a plurality of first output voltages according to a plurality of first input voltages;

utilizing the second amplifier stage, coupled to the first amplifier stage, to generate a plurality of second output voltages according to the first output voltages;

utilizing the second output stage circuit to be coupled to the second amplifier stage and a first output stage circuit;

when the offset calibration is performed, utilizing the first common-mode feedback circuit to keep an output common-mode voltage of the second output stage circuit at a predetermined value; and utilizing the logic loop circuit to adjust a difference between the first output voltages of the first amplifier stage to be close to zero.

9. The control method of claim 8, wherein the operational amplifier further comprises a second common-mode feedback circuit; the control method further comprises:

when the offset calibration is performed, utilizing the second common-mode feedback circuit to keep an output common-mode voltage of the first output voltages of the first amplifier stage at a voltage close to a common-mode voltage of a plurality of second input voltages of the second amplifier stage, wherein the common-mode voltage is produced after the operational amplifier is turned on.

10. The control method of claim 9, wherein the operational amplifier further comprises a bias circuit; the control method further comprises:

utilizing the bias circuit to generate the voltage close to the common-mode voltage of the second input voltages of the second amplifier stage.

11. The control method of claim 8, the control method further comprises:

utilizing the second output stage circuit to replicate an equivalent or a scaled-down version of the first output stage circuit.

12. The control method of claim 8, wherein the second output stage circuit is coupled to the second amplifier stage, and the output common-mode voltage of the second output stage circuit is close to an output common-mode voltage produced after the operational amplifier is turned on.

13. The control method of claim 8, wherein the operational amplifier further comprises a first output stage circuit; the control method further comprises:

when the logic loop circuit adjusts the difference between the first output voltages of the first amplifier stage, turning off the first output stage circuit.

14. The control method of claim 8, further comprising:

after the offset calibration finishes, the difference between the first output voltages of the first amplifier stage is close to zero.

15. The control method of claim 9, further comprising:

after the offset calibration finishes, turning off the second output stage circuit, the first common-mode feedback circuit, the second common-mode feedback circuit and the logic loop circuit, and turning on the first output stage circuit and a third common-mode feedback circuit.

16. The control method of claim 8, wherein the third common-mode feedback circuit is coupled to the first amplifier stage, and configured to keep an output common-mode voltage of a plurality of output voltages of the operational amplifier at the predetermined value.

17. An operational amplifier, comprising:

a first amplifier stage, configured to generate a plurality of first output voltages according to a plurality of first input voltages;

a second amplifier stage, coupled to the first amplifier stage, the second amplifier stage configured to generate a plurality of second output voltages according to the first output voltages;

a second output stage circuit, coupled to the second amplifier stage and a first output stage circuit, the second output stage circuit configured to replicate a voltage at each node of the first output stage circuit;

a first common-mode feedback circuit, coupled to the second amplifier stage and the second output stage circuit, the first common-mode feedback circuit configured to keep an output common-mode voltage of the second output stage circuit at a predetermined value; and a logic loop circuit, coupled to the first amplifier stage, the logic loop circuit configured to adjust a difference between the first output voltages of the first amplifier stage.

18. The operational amplifier of claim 17, further comprising:

a bias circuit, configured to generate a voltage close to a common-mode voltage of a plurality of second input voltages of the second amplifier stage, wherein the common-mode voltage is produced after the operational amplifier is turned on; and a second common-mode feedback circuit, coupled to the first amplifier stage, the second common-mode feedback circuit configured to keep an output common-mode voltage of the first output voltages of the first amplifier stage at a reference voltage, wherein the voltage generated by the bias circuit serves as the reference voltage.

19. The operational amplifier of claim 8, further comprising:

a plurality of switches, configured to control connection between the first amplifier stage, the second amplifier stage, the first output stage circuit, the second output stage circuit, the first common-mode feedback circuit, the logic loop circuit and the second common-mode feedback circuit to enable the operational amplifier to operate in an offset calibration phase.

20. The operational amplifier of claim 17, wherein the second output stage circuit is configured to replicate an equivalent or a scaled-down version of the first output stage circuit.

* * * * *